(12) United States Patent
Wallace et al.

(10) Patent No.: US 8,233,210 B2
(45) Date of Patent: Jul. 31, 2012

(54) ILLUMINATION APERTURE FOR OPTICAL LITHOGRAPHY

(75) Inventors: Charles Wallace, Portland, OR (US); Matthew Tingey, Hillsboro, OR (US); Swaminathan Sivakumar, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 833 days.

(21) Appl. No.: 12/319,014

(22) Filed: Dec. 30, 2008

(65) Prior Publication Data

US 2010/0165317 A1 Jul. 1, 2010

(51) Int. Cl.
*G02B 26/02* (2006.01)
*G03B 27/54* (2006.01)
*G03B 27/72* (2006.01)

(52) U.S. Cl. .............................. 359/227; 355/67; 355/71
(58) Field of Classification Search .................... 355/53, 355/67, 71; 359/227, 385, 387
See application file for complete search history.

(56) References Cited

U.S. PATENT DOCUMENTS

| | | | |
|---|---|---|---|
| 6,261,727 B1 | 7/2001 | Wang | |
| 2002/0177048 A1* | 11/2002 | Saitoh et al. | 430/5 |
| 2004/0048167 A1* | 3/2004 | Smith | 430/5 |
| 2006/0072095 A1* | 4/2006 | Kudo et al. | 355/67 |
| 2009/0002664 A1* | 1/2009 | Tanitsu | 355/67 |
| 2009/0180088 A1* | 7/2009 | Schroeder et al. | 355/53 |

\* cited by examiner

*Primary Examiner* — Hung Henry Nguyen
*Assistant Examiner* — Steven H Whitesell Gordon
(74) *Attorney, Agent, or Firm* — Winkle, PLLC

(57) ABSTRACT

Embodiments of systems and methods for providing a hybrid illumination aperture in optical lithography are generally described herein. Other embodiments may be described and claimed.

6 Claims, 6 Drawing Sheets

US 8,233,210 B2

ILLUMINATION APERTURE FOR OPTICAL LITHOGRAPHY

FIELD OF THE INVENTION

The field of invention relates generally to the field of semiconductor integrated circuit manufacturing and, more specifically but not exclusively, relates to the implementation of a hybrid illumination aperture in optical lithography.

BACKGROUND INFORMATION

Patterns may be fabricated on a semiconductor (e.g., a silicon wafer) by transmitting beams of light through a mask and onto a surface of the semiconductor. To produce patterns with extremely small pitches (i.e., the distances between lines or features), a series of resolution enhancement techniques (RETs) have been employed to enhance a resolution limit of optical lithography while providing a manufacturable depth of focus (DOF). A principle RET applied in low $k_1$ lithography in the fabrication of semiconductor devices is off-axis illumination (OAI), which has been shown to be effective in increasing DOF while improving image resolution. While OAI may be effective for a narrow range of applications, for example a pattern layout with a densely packed series of repeated features, the process window for layouts of features combining regions of isolated and dense patterns may be vanishingly small.

One method for enhancing the lithography process window is to employ an illumination aperture in an illuminator assembly of a projector system. Referring now to FIG. 1 (Prior Art), the basic components that make up a projection system for photolithography are schematically illustrated. A light beam 105 is condensed by illuminator lens 110 so that reticle 115 that includes feature 120, is uniformly illuminated. Most of the light beam 105 passes straight on as the zero order diffraction maximum 125, while first order diffraction maxima 130 and higher order diffraction maxima 135 are diffracted off to the side. These are then focused by projection lens 140 onto focal plane 145. Since no information (other than overall brightness) is contained in the zero order diffraction maximum 125, it is imperative that at least some of the higher order beams, such as the first order diffraction maxima 130 and higher order diffraction maxima 135, contribute to the image. This necessarily widens the angle of the focusing cone, resulting in a reduced DOF.

In FIG. 2 (Prior Art), the basic setup of FIG. 1 has been modified so that light beam 105 is blocked from the center of illuminator lens 110 by an illumination aperture filter 210, being limited to coming in obliquely (off-axis). The result of this is that the zero order diffraction maximum 125 is forced over the to the edge of projection lens 140 while first order diffraction maxima 130 passes (approximately) through the center of the projection lens 140, thereby allowing a narrower angle for the focusing cone, with a corresponding increase in DOF.

In FIG. 3 (Prior Art), a different modification of the basic setup of FIG. 1 has been introduced. This is the placement of phase-type filter 310 at a pupil plane of the projection lens 140. Its effect is to change the phase of the first order diffraction maxima 130 and higher order diffraction maxima 135 by 180 degrees relative to that of the zero order diffraction maxima 125. This results in an increase of DOF for dense patterns.

BRIEF DESCRIPTION OF THE DRAWINGS

The present invention is illustrated by way of example and not as a limitation in the figures of the accompanying drawings, in which FIG. 1 (Prior Art) is a schematic illustration of a projection system used in photolithography.

DETAILED DESCRIPTION

Figure 3:
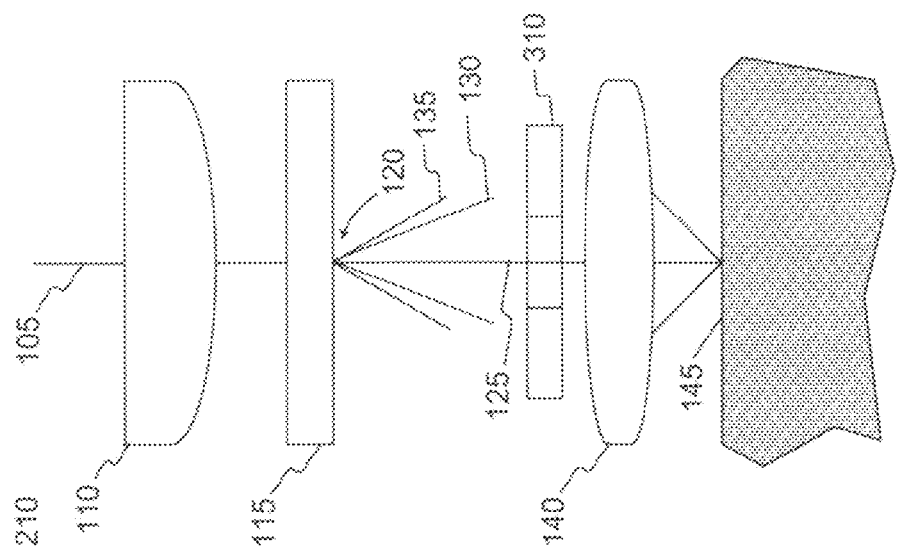
FIG. 3 (Prior Art) illustrates another embodiment of the projection system of FIG. 1 including a phase-type pupil filter.
Figure 2:
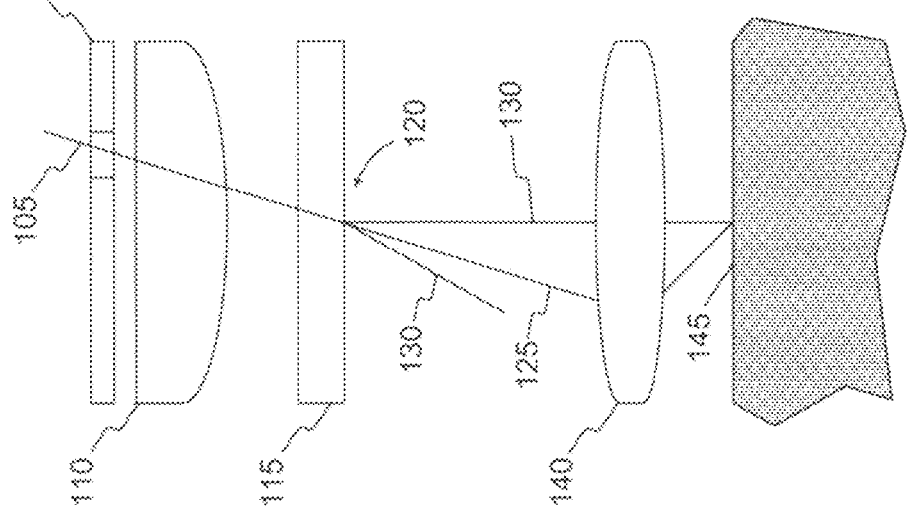
FIG. 2 (Prior Art) is an alternate embodiment of the projection system of FIG. 1 in which an illumination aperture filter with off-axis illumination has been introduced.
Figure 1:
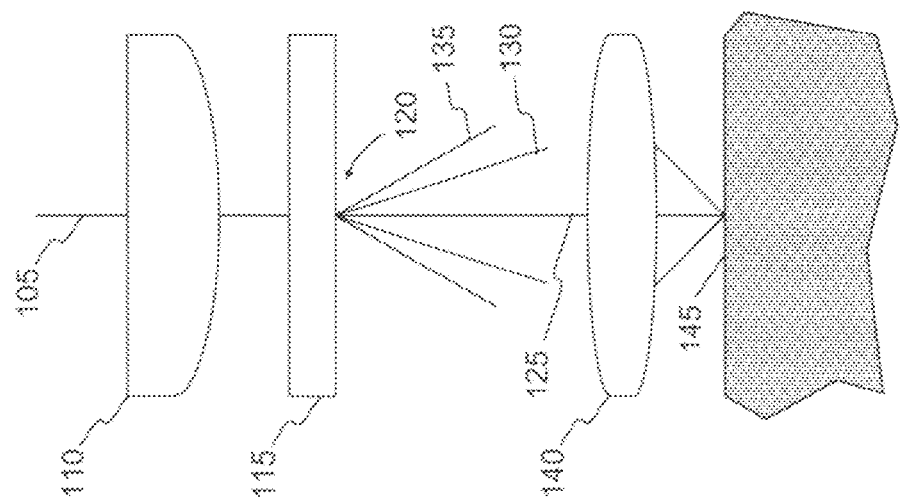

An apparatus and methods for filtering an illumination source are described in various embodiments. In the following description, numerous specific details are set forth such as a description of methods and an apparatus of an integrated annular and dipole illumination source for the patterning of very small unidirectional pitches and two dimensional structures. One skilled in the relevant art will recognize that the invention can be practiced without one or more of the specific details, or with other methods, components, materials, etc. In other instances, well-known structures, materials, or operations are not shown or described in detail to avoid obscuring aspects of the invention.

It would be an advance in the art of semiconductor manufacturing, and more specifically to the field of lithography, to provide a new illumination source with variable intensity using combined annular and dipole elements in an integrated, hybrid illumination aperture. The hybrid illumination aperture employs one or more grey scale illumination intensity filters to vary relative intensity of the illumination source to enhance the contrast of features formed on a substrate surface at a desired pitch. A combination of the annular and dipole elements in the hybrid illumination aperture provides an optimized illumination source needed for patterning of aggressively pitched features in a first direction while allowing for the patterning of less aggressively pitched features in the first direction and a perpendicularly oriented second direction with dense to isolated pitches without significantly degrading an aerial image intensity of the aggressively pitched features in the first direction.

As a result, a process window for the patterning of features is improved over a large range of pitches and line widths in two directions, particularly for layouts with asymmetric design rules with a minimum pitch in the first direction and a relaxed design rule in the second direction. Expansion of the process window may be enabled by selectively employing filters on the dipole and/or annular elements to optimize illumination characteristics as a function of mask layout. Shape and position of the dipole and/or annular elements may also be adjusted to expand the process window for the patterning of features.

One such advance in the art may comprise a hybrid aperture for optical lithography with a mask having an opaque coating, the opaque coating defining an annulus and a dipole wherein the dipole comprises two laterally opposite regions and the annulus is positioned substantially between the two laterally opposite regions.

Contemporary semiconductor lithography is used to form features (e.g., transistor fins, gate stacks, etc.) on a substrate and enables scaling of semiconductor devices for a lithography ratio of imaged half-pitch to optical resolution limit (or exposure k1 factor) at approximately equal to or less than 0.30, where;

$$R = \frac{k1(\lambda)}{NA}$$

where:
R=resolution or half pitch (p/2)
λ=wavelength of light
NA=numerical aperture of the optical system Increasing the numerical aperture of the optical system and/or decreasing the wavelength of light used for illumination are variables that may be used to drive resolution to a desired pitch for improved imaging performance. Another method used to improve imaging performance of small features is off axis illumination. Off-axis illumination refers to any illumination shape that significantly reduces or eliminates an on-axis component of the illumination, or light that strikes a mask at near normal incidence. To effectively apply off-axis illumination, the shape and size of the illumination is optimized for the specific mask pattern being printed to maximize depth of focus for a desired pitch. Optimum off-axis illumination can be determined by deriving center sigma values, where;

$$\sigma_c = \frac{\lambda}{\sqrt{2} \, pNA}$$

Further, patterning may be adjusted by tuning a partial coherence factor σ to a desired pattern and resulting pitch, where;

$$\sigma = \frac{i_{NA}}{p_{NA}}$$

where;
$i_{NA}$=illumination numerical aperture
$p_{NA}$=projection numerical aperture Now turning to the figures, FIGS. 4-8 illustrate alternate embodiments of hybrid illumination apertures that may be selectively designed and implemented to allow the patterning of very small unidirectional pitches (low k1) as well as two dimensional structures in both directions, for example x and y directions along a plane. In a first embodiment of FIG. 4, a Y-dipole and an annular hybrid illumination aperture is illustrated as a Y-propeller aperture 400. Opaque portions 410 of the Y-propeller aperture 400 are positioned to prevent or significantly reduce transmission of light through the Y-propeller aperture 400 through those areas. In one embodiment, the Y-propeller aperture 400 is constructed of a transparent substrate, such as quartz, fused silica, calcium fluoride (CaF2) or similar material and masked with a coating with sufficient thickness to provide opaque portions 410.

The coating may be any material used to provide a mask on the substrate using methods known to one skilled in the art.

Figure 4:
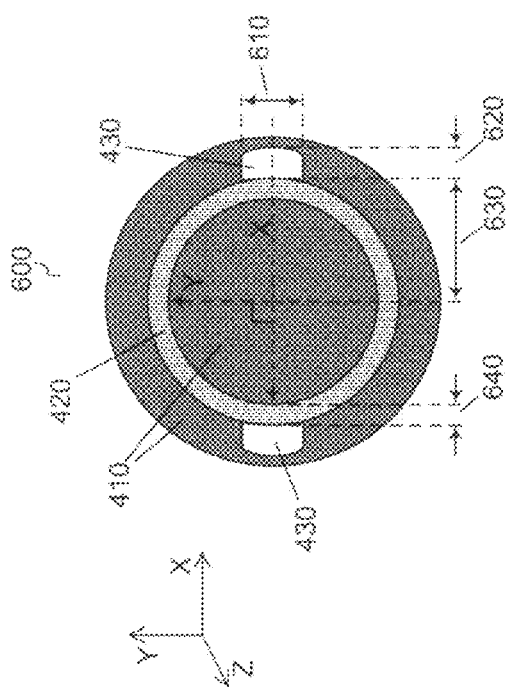
FIGS. 4 through 8 illustrate alternate embodiments of a hybrid illumination aperture.

For example, the opaque portions 410 may be coated with chrome or other material that adheres to the transparent substrate and blocks or significantly reduces transmission of light and is patterned to provide the opaque portions 410, and transparent portions, such as the dipoles 430 of FIG. 4. Two dipole portions 430 are illustrated in this embodiment, though the embodiment is not so limited. Further, an annulus 420 is formed adjacent to and substantially between the dipole 430. The dipoles 430 in this embodiment are oriented along a Y-axis, 90 degrees from a horizontal, along the annulus 420 to create the y-propeller aperture 400. In this embodiment, the annulus 420 is configured with a grey scale illumination filter to change a relative intensity of an illumination source between the annulus 420 and dipole 430. Changing the relatively intensity of the illumination source can be used to enhance the contrast of features at the pitches of interest. In an alternate embodiment, the dipoles 430 may also be configured with a grey scale illumination filter. The grey scale illumination filter may be configured as a grid with a selectively designed set of holes with predetermined layout, shape, orientation, and sizing formed in a layer to allow a portion of illumination to pass through the grey scale illumination intensity filter. In another embodiment, neutral density filters are combined with refractive optics to form grey scale illumination. A pixilated source may optionally be employed to vary intensity at any point on a grid.

Figure 5:
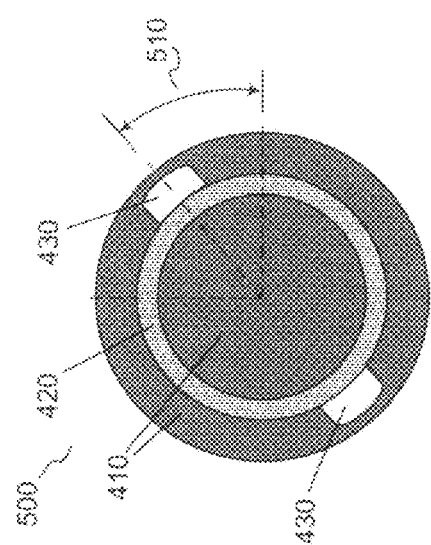

An alternate embodiment of the propeller aperture illustrated in FIG. 4 is provided in FIG. 5. In this embodiment, the dipoles 430 are oriented at a dipole angle 510 of 45 degrees, providing a 45-propeller aperture 500. In alternate embodiments, the dipole angle 510 may be oriented at 30 degrees or 60 degrees, though the embodiment is not so limited.

Figure 6:
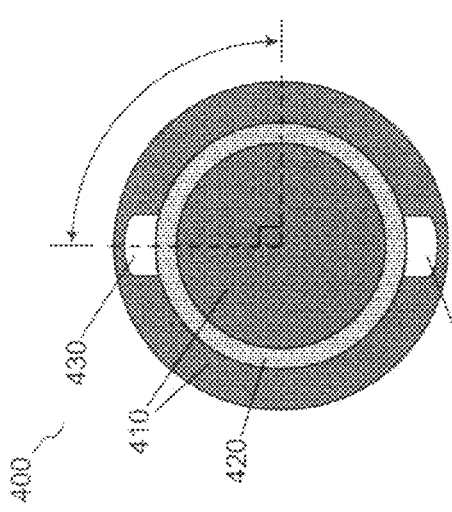

A further embodiment of the propeller aperture illustrated in FIG. 4 is illustrated in FIG. 6. In this embodiment, the dipoles 430 are oriented along an X-axis, providing an x-propeller aperture 600. The dipoles 430 in this embodiment are substantially rectangularly shaped, however the dipoles 430 may be selectively designed in one or more alternate geometric shapes such as wedges, circles, squares, triangles, etc. The annulus 420 in this embodiment is substantially ring-shaped having an annulus width 640 adjacent to the dipoles 430 along an annulus outside radius 630. The annulus 420 and each dipole 430 has been selectively designed with a dipole length 610 and a dipole width 620 to pattern features with a desired pitch in a first direction while providing desired patterning capabilities for two dimensional structures along an X-Y plane of a Cartesian coordinate system.

Figure 7:
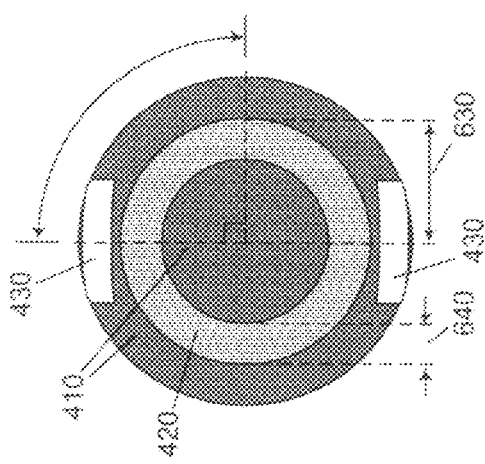
Figure 8:
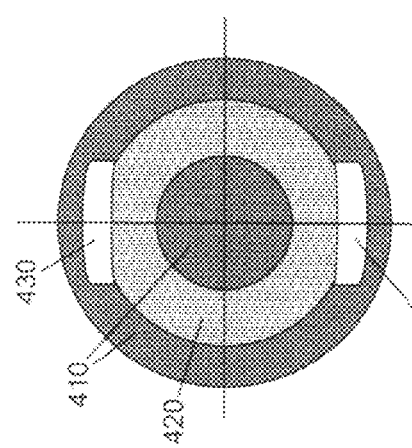

Another embodiment of a hybrid illumination aperture is illustrated in FIG. 7. In this embodiment, the dipoles 430 are detached or no longer directly adjacent to the annulus 420. Separating the dipoles 430 and the annulus 420 creates a 'forbidden' pitch region where an aerial image intensity is severely reduced. This may be an intended consequence if design requirements do not require a continuous range of pitches to be patterned. Separating the dipoles 430 from the annulus 420 may provide a further benefit as it might make it easier and less expensive for the source manufacturer to produce than an aperture with a dipole 430 and an annulus 420 that are connected. Alternately, the embodiment of a hybrid illumination aperture illustrated in FIG. 8 provides for an overlapping annulus 420 and dipoles 430. Providing overlapping annulus 420 and dipole 430 elements may generally allow for good contrast over a continuous range of pitches.

Figure 9:
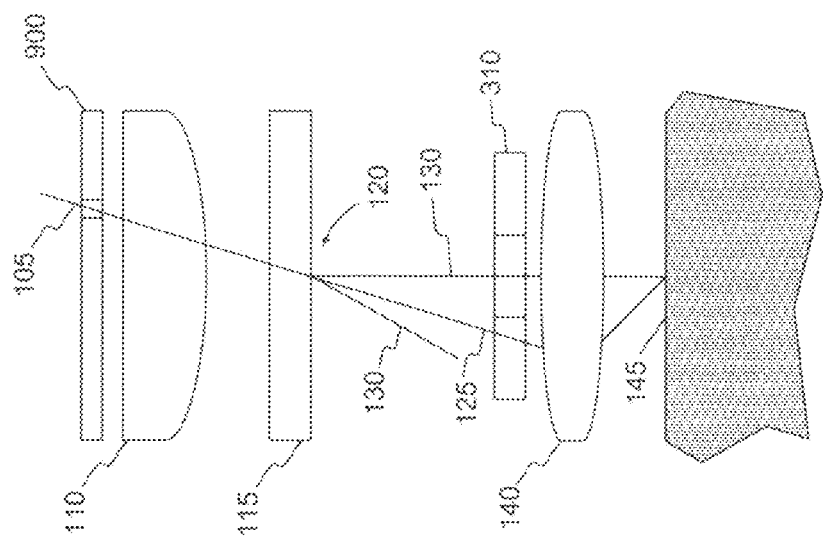
FIG. 9 illustrates an embodiment of a projection system with a hybrid illumination aperture.

FIG. 9 illustrates an embodiment of a projection system with a hybrid illumination aperture 900. The hybrid illumination aperture may be an embodiment of the hybrid illumination apertures illustrated in FIGS. 4-8 such as the y-propeller aperture, the x-propeller aperture, the 45-propeller aperture, or variations thereof.

Figure 10:
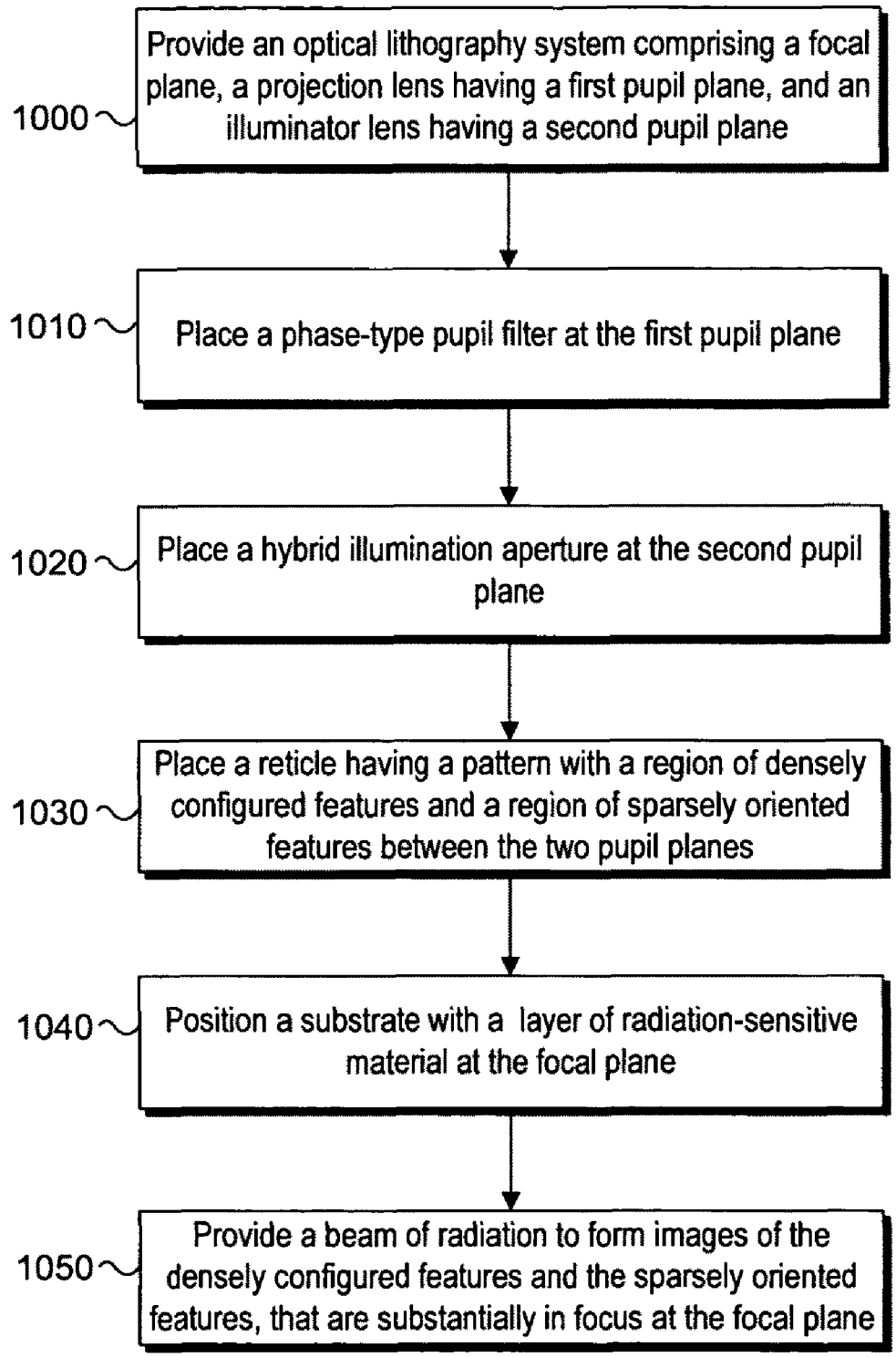
FIG. 10 is an embodiment of a method for filtering an illumination source with a hybrid illumination aperture.

FIG. 10 is an embodiment of a method for filtering an illumination source with a hybrid illumination aperture. In element 1000, an optical lithography system is provided having a focal plane, a projection lens having a first pupil plane, and an illuminator lens having a second pupil plane. A phase type pupil filter is optionally placed at the first pupil plane in element 1010. Application of the phase type pupil filter to provide polarized illumination may be desirable in applications using high intensity sources with embodiments of the hybrid illumination aperture, particularly due to use of the dipole 430 elements. However, in some applications, use of unpolarized illumination is desirable.

A hybrid illumination aperture is placed at the second pupil plane in element 1020. In element 1030, a reticle having a pattern with a region of densely configured features and a region of sparsely oriented features is placed between the two pupil planes. In element 1040, a substrate is positioned with a layer of radiation sensitive material at the focal plane. A beam of radiation from an illumination source is provided to form images of the densely configured features and the sparsely oriented features that are substantially in focus at the focal plane in element 1050.

Figure 11:
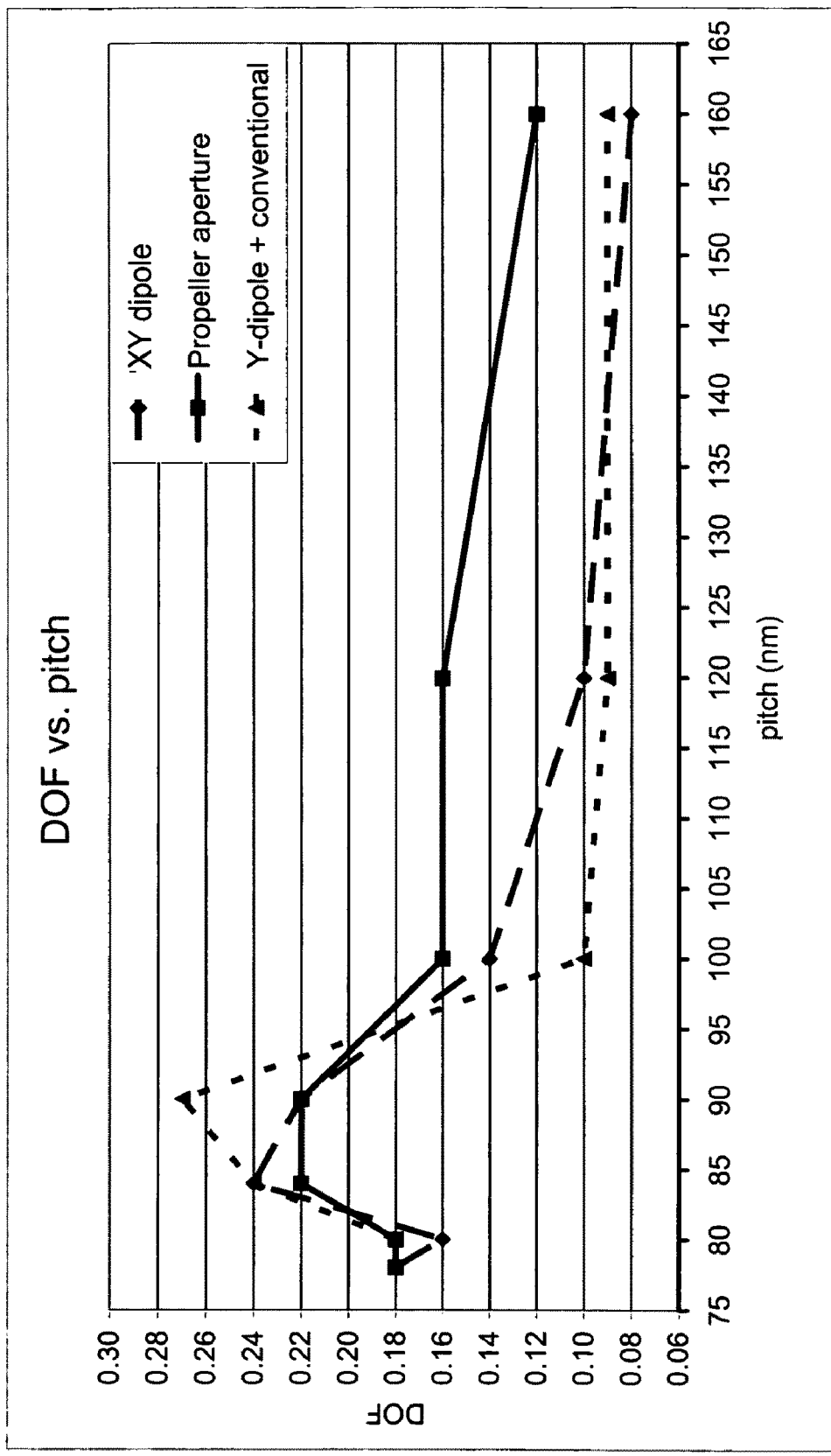
FIG. 11 is a graph that illustrates depth of focus (DOF) as a function of pitch for three different illumination apertures.

FIG. 11 is a graph that illustrates depth of focus (DOF) as a function of pitch for three different illumination apertures. In this graph, a conventional illumination aperture with dipoles located along an x-axis and along a y-axis is compared to another conventional illumination aperture with dipoles located along a y-axis against a hybrid illumination aperture with a propeller aperture configuration such as the y-propeller aperture 400. Typically, it is desirable to maximize the minimum depth of focus over the desired range of pitches. As shown in the graph of FIG. 11, the y-propeller aperture 400 provides a higher depth of focus over a large range of pitch.

Figure 12:
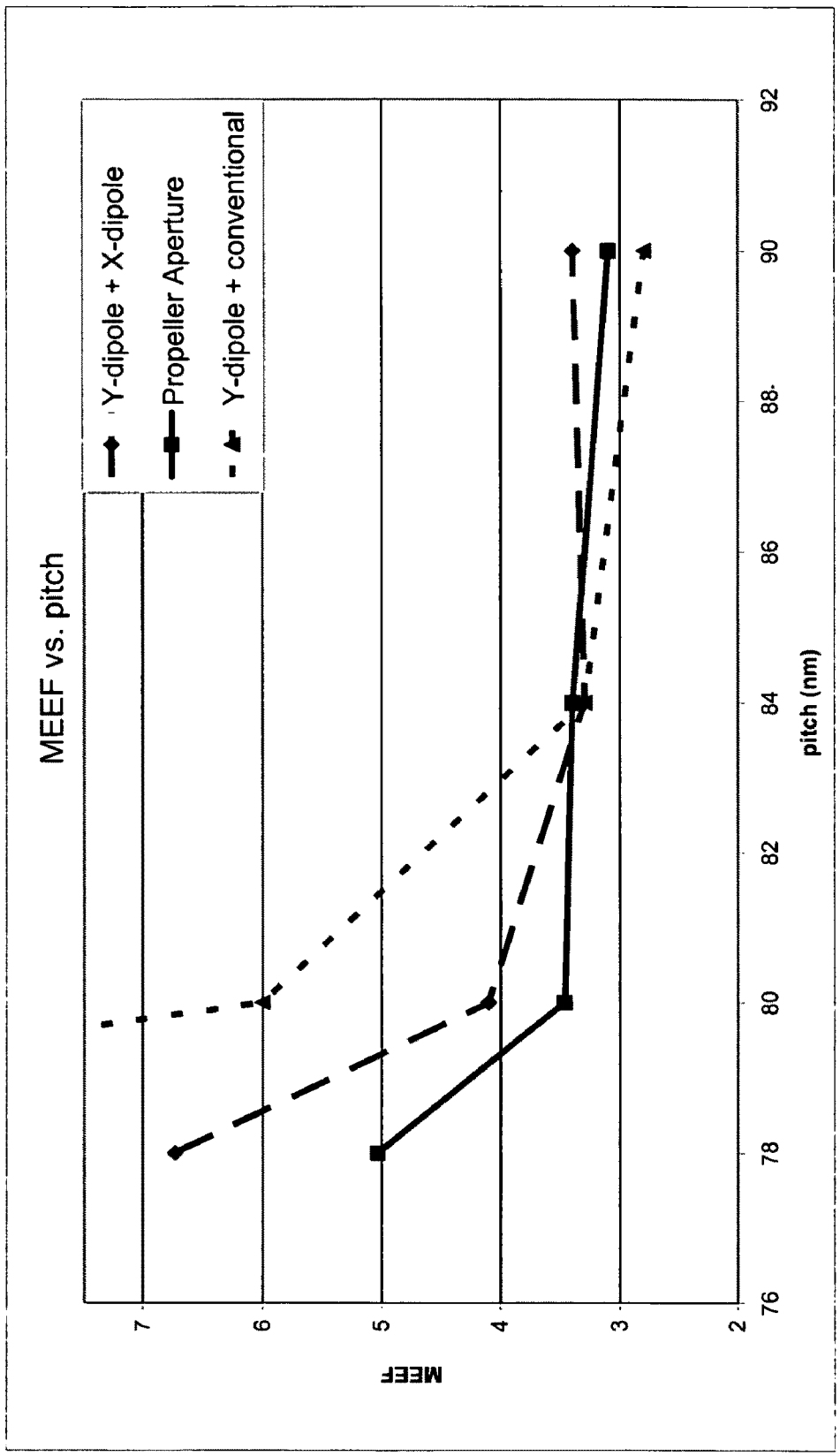
FIG. 12 is a graph that illustrates a mask error enhancement factor (MEEF) as a function of pitch for three different illumination apertures.

FIG. 12 is a graph that illustrates a mask error enhancement factor (MEEF) as a function of pitch for three different illumination apertures. In this graph, a conventional illumination aperture with dipoles located along an x-axis and along a y-axis is compared to another conventional illumination aperture with dipoles located along a y-axis against a hybrid illumination aperture with a propeller aperture configuration such as the y-propeller aperture 400. Typically, it is desirable to minimize the MEEF over a range of pitch. As shown in the graph of FIG. 12, the y-propeller aperture 400 provides a lower MEEF, especially at lower pitch values. When selecting a source design, it is typically beneficial to minimize the MEEF while maximizing the minimum depth of focus (DOF). This is generally a balancing act and depending on the requirements of a particular patterning process, tradeoffs are made to optimize either the MEEF or DOF. The MEEF and DOF are generally the largest two variables in lithography affecting critical dimension (CD) variation. Application of the y-propeller aperture 400 improves both MEEF and DOF, which is a substantial improvement over conventional apertures. Benefits offered by the y-propeller aperture 400, as depicted in FIG. 11 and FIG. 12, provide results not offered by conventional apertures.

A plurality of embodiments of systems and methods for implementing a hybrid illumination aperture in optical lithography have been described. The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations.

However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. An hybrid aperture for optical lithography, comprising:
   a mask comprising an opaque coating, the opaque coating defining an annulus and dipoles, wherein the dipoles comprise two laterally opposite regions and the annulus is positioned substantially between the two laterally opposite regions, and wherein the dipoles are positioned directly adjacent to the annulus.

2. The hybrid aperture of claim 1, further comprising a grey scale illumination filter on the annulus.

3. The hybrid aperture of claim 2, further comprising a grey scale illumination filter on the dipoles.

4. The hybrid aperture of claim 1, wherein the dipoles are substantially rectangularly shaped.

5. The hybrid aperture of claim 1, wherein the hybrid aperture comprises a transparent substrate formed from a material selected from the group consisting of quartz, fused silica, and calcium fluoride (CaF2).

6. The hybrid aperture of claim 1, wherein the dipoles are positioned along a y-axis.

* * * * *